United States Patent
Konno

(10) Patent No.: US 10,586,805 B2
(45) Date of Patent: Mar. 10, 2020

(54) SEMICONDUCTOR MEMORY DEVICE

(71) Applicant: TOSHIBA MEMORY CORPORATION, Tokyo (JP)

(72) Inventor: Atsushi Konno, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/906,423

(22) Filed: Feb. 27, 2018

(65) Prior Publication Data
US 2019/0088674 A1    Mar. 21, 2019

(30) Foreign Application Priority Data
Sep. 20, 2017 (JP) ................... 2017-180612

(51) Int. Cl.
| | | |
|---|---|---|
| H01L 27/11582 | (2017.01) | |
| H01L 27/1157 | (2017.01) | |
| H01L 27/11565 | (2017.01) | |
| H01L 27/11573 | (2017.01) | |
| H01L 27/11575 | (2017.01) | |
| H01L 27/11519 | (2017.01) | |
| H01L 27/11524 | (2017.01) | |
| H01L 27/11556 | (2017.01) | |

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11575* (2013.01); *H01L 27/11519* (2013.01); *H01L 27/11524* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 9,064,969 B2 | 6/2015 | Konno et al. | |
| 9,196,627 B2 | 11/2015 | Konno et al. | |
| 2015/0263025 A1* | 9/2015 | Nakagami | H01L 27/11565 257/324 |

FOREIGN PATENT DOCUMENTS

| | | |
|---|---|---|
| JP | 2015-028982 A | 2/2015 |
| JP | 2015-056443 A | 3/2015 |

* cited by examiner

*Primary Examiner* — Long Pham
(74) *Attorney, Agent, or Firm* — Kim & Stewart LLP

(57) ABSTRACT

According to one embodiment, a semiconductor memory device includes a first electrode layer having a first area, a second area, and a connection area connecting the first area to the second area, and a plurality of semiconductor pillars extending in a first direction through the first electrode layer in the first area and the second area. The plurality of semiconductor pillars are arranged in an array in a second direction and in a third direction intersecting with the second direction, the second direction and the third direction being parallel to the surface of the first electrode layer, and the connection area has no semiconductor pillars disposed therein.

18 Claims, 8 Drawing Sheets

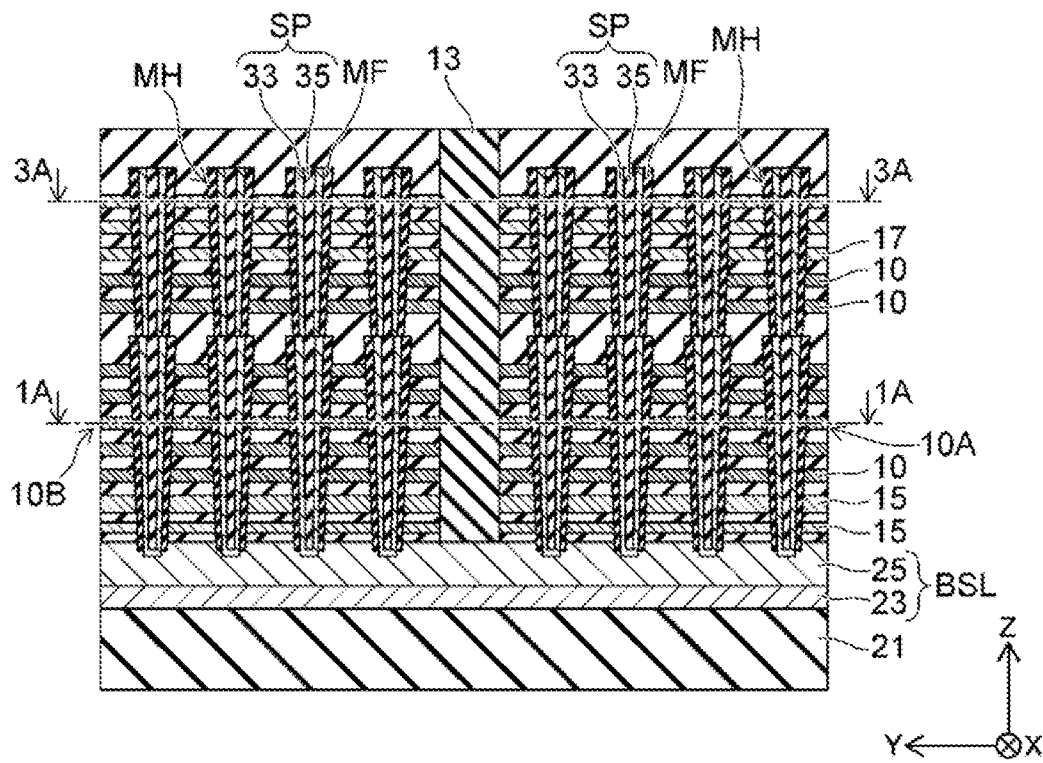
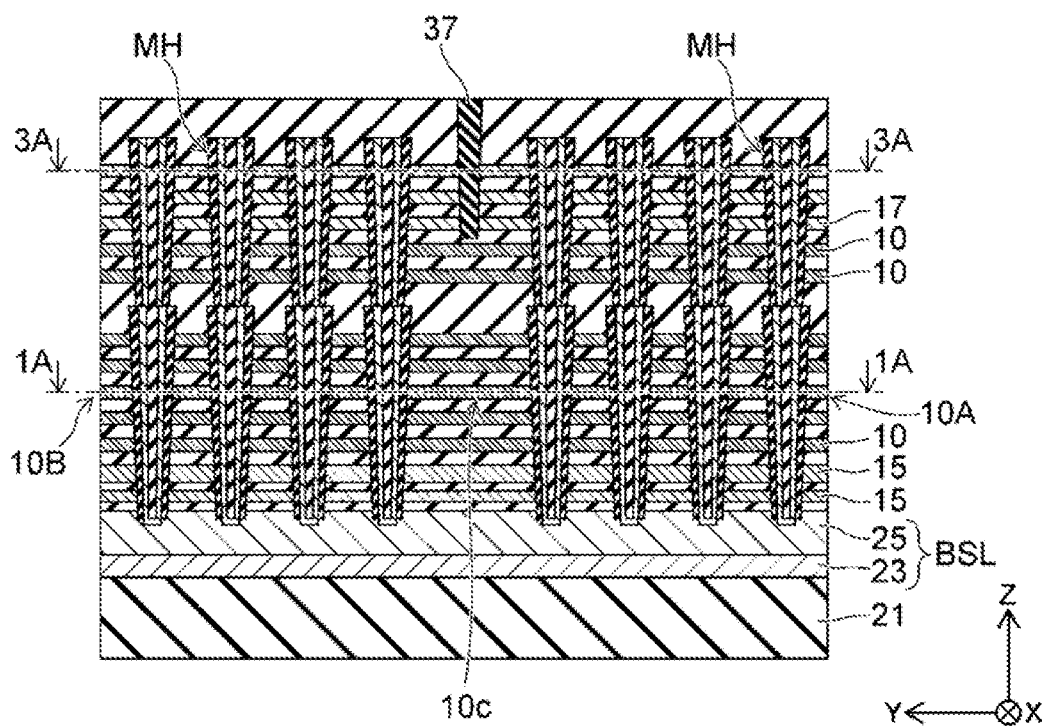

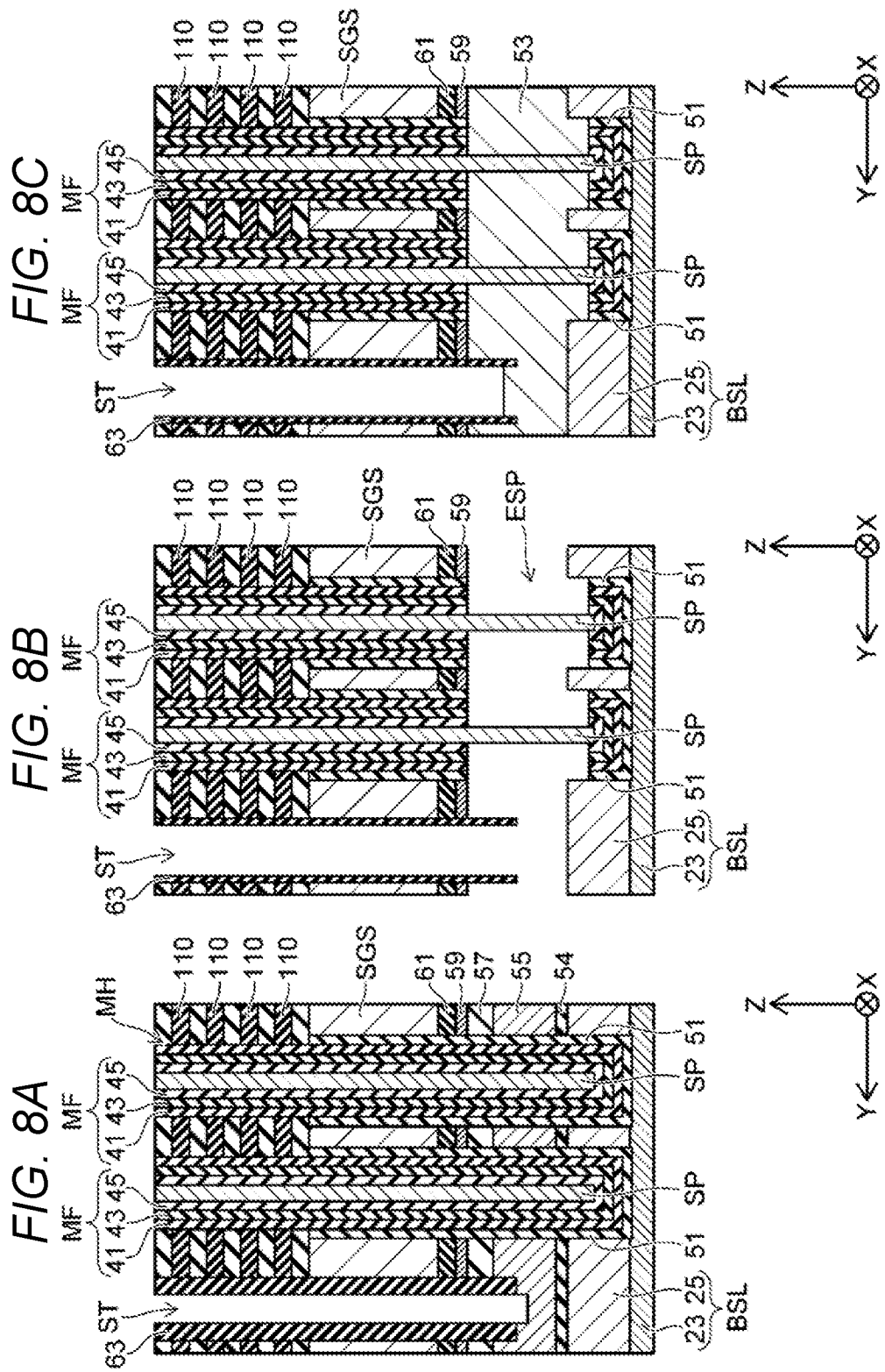

SEMICONDUCTOR MEMORY DEVICE

CROSS-REFERENCE TO RELATED APPLICATION

This application is based upon and claims the benefit of priority from Japanese Patent Application No. 2017-180612, filed, Sep. 20, 2017, the entire contents of which are incorporated herein by reference.

FIELD

Embodiments described herein relate generally to a semiconductor memory device.

BACKGROUND

In a semiconductor memory device in which memory cells are three-dimensionally arranged, such as a three-dimensional NAND type flash memory device, multiple word lines are stacked on a substrate and semiconductor pillars penetrating the ward line. Memory cells are formed at intersections of the semiconductor pillar and the word lines. For an increased memory capacity in a semiconductor memory device having such a structure, it is effective to increase a density of semiconductor pillars and increase a number of stacked word lines. However, in a memory cell array including densely packed word lines and miniaturized semiconductor pillars, there is a high possibility that structural defects may occur as the number of stacked word lines increases.

DESCRIPTION OF THE DRAWINGS

FIGS. 2A and 2B are schematic cross-sectional views of a semiconductor memory device according to the first embodiment.

FIGS. 8A to 8C are schematic cross-sectional views illustrating a process of manufacturing a semiconductor memory device according to the second embodiment.

DETAILED DESCRIPTION

Figure 1:
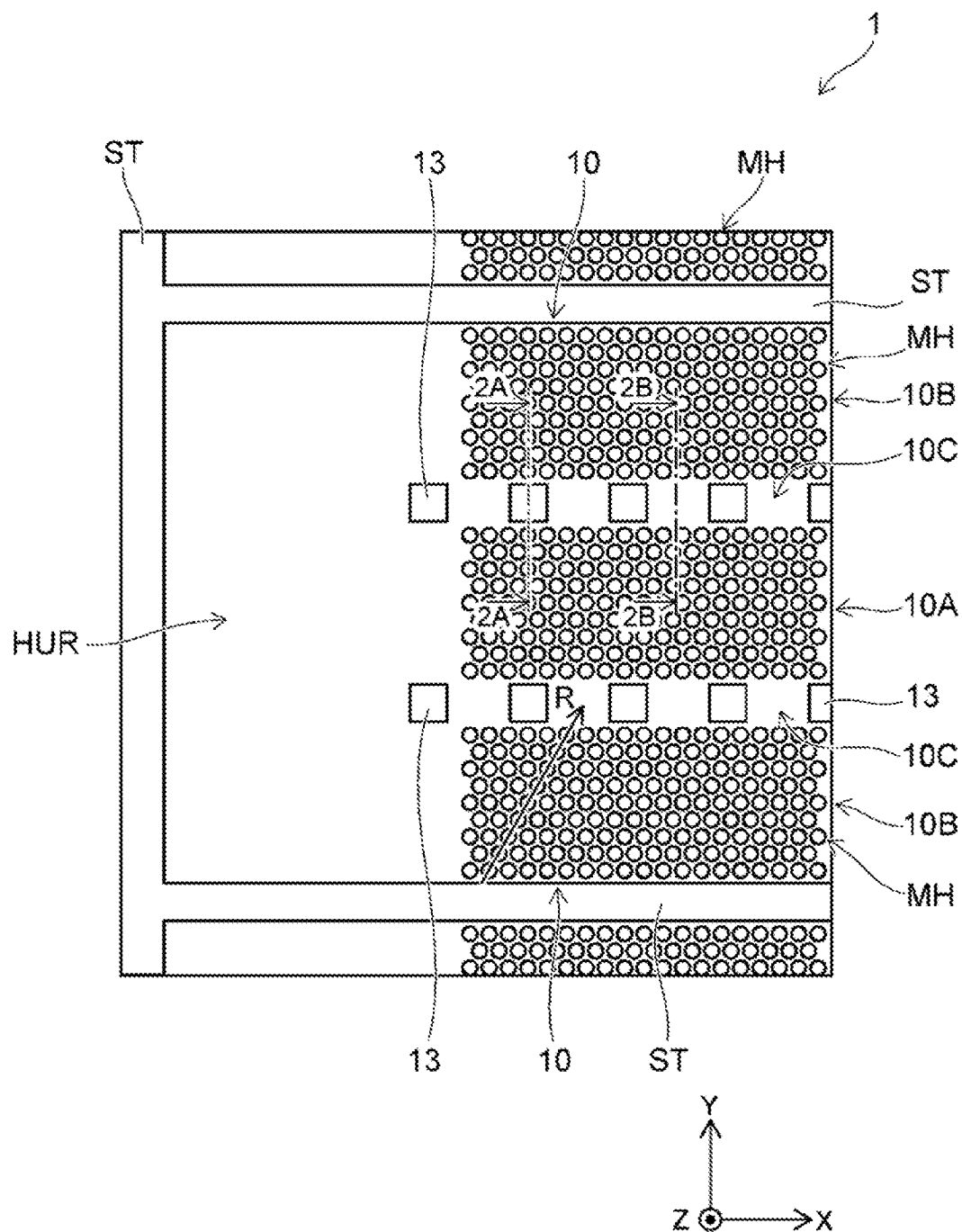
FIG. 1 is a schematic plan view of a semiconductor memory device according to a first embodiment.

In general, according to an embodiment, a semiconductor memory device includes a first electrode layer having a first area, a second area, and a connection area connecting the first area to the second area, and a plurality of semiconductor pillars extending in a first direction through the first electrode layer in the first area and the second area. The plurality of semiconductor pillars are arranged in an array in a second direction and in a third direction intersecting with the second direction, the second direction and the third direction being parallel to the surface of the first electrode layer, and the connection area has no semiconductor pillars disposed therein.

Hereinafter, embodiments will be described with reference to the drawings. The same parts in the drawings will be denoted by the same reference numerals, a detailed description thereof will be appropriately omitted from subsequent descriptions of embodiments, and description will focus on differences. In addition, it should be noted that the drawings are schematic or conceptual and that depicted relationships between the thicknesses and the widths of each part, the ratio of the sizes of different parts, and the like are not necessarily the same as actual ones. Even in a case of representing the same part in different drawings, the dimensions and/or relative sizes thereof may be represented differently in the respective drawings.

In the following description, the arrangement and configuration of respective parts will be described using the X axis, the Y axis, and the Z axis illustrated in the respective drawings. The X axis, the Y axis, and the Z axis are orthogonal to each other, and represent the X direction, the Y direction, and the Z direction, respectively. One direction along the Z axis may be described as an upward direction and the opposite direction may be described as a downward direction.

First Embodiment

FIG. 1 is a schematic plan view of a semiconductor memory device 1 according to a first embodiment. In FIG. 1, an NAND type flash memory device is illustrated as an example of the semiconductor memory device 1.

The semiconductor memory device 1 includes a plurality of electrode layers 10 and a plurality of memory holes MH. The electrode layers 10 are each formed in a plate shape that extends in the X direction and the Y direction. The memory holes MH penetrate the electrode layers 10 and extend in the Z direction.

As illustrated in FIG. 1, the semiconductor memory device 1 includes slits ST that separate the plurality of electrode layers 10 into regions arranged in the Y direction. The slits ST are on outer edges of electrode layers 10. Inside each slit ST, an insulating film such as a silicon oxide film is embedded so as to electrically insulate adjacent electrode layers 10 from each other in the XY-plane.

Each electrode layer 10 includes a first area 10A, a second area 10B, and a connection area 10C. In the first area 10A and the second area 10B the electrode layer 10 functions as a word line. The electrode layer 10 in connection areas 10C connects the first areas 10A to the second areas 10B, and thus electrically connect adjacent word lines portions across the first areas 10A and the second areas 10B. Each electrode layer 10 further includes a lead-out region HUR.

The semiconductor memory device 1 further includes insulators 13, which penetrate the electrode layers 10 and extend in the Z direction. The insulators 13 are, for example, columnar silicon oxide bodies, and are located between a first area 10A and a second area 10B of the electrode layers 10. The connection areas 10C are formed respectively between the insulators 13, which are arranged aligned in the X direction.

As illustrated in FIG. 1, in the first area 10A and the second area 10B, the memory holes MH are arranged in an array in the X direction and the R direction intersecting with the X direction. The R direction is in a plane parallel to the surface of the electrode layers 10.

FIGS. 2A and 2B are schematic cross-sectional views of the semiconductor memory device 1 according to the first embodiment. FIG. 2A is a cross-sectional view taken along the line 2A-2A indicated in FIG. 1, and FIG. 2B is a cross sectional view taken along the line 2B-2B indicated in FIG. 1. FIG. 1 is a cross-sectional view taken along the lines 1A-1A respectively indicated in FIGS. 2A and 2B.

As illustrated in FIGS. 2A and 2B, the semiconductor memory device 1 includes a source line BSL formed on an interlayer insulating film 21. The plurality of electrode layers 10 is stacked on the source line BSL in the Z direction.

The source line BSL may be formed on an interlayer insulating film 21 formed on a substrate (not specifically illustrated), such as a silicon substrate. The source line BSL includes, for example, a metal layer 23 and a semiconductor layer 25 stacked in the Z direction. The metal layer 23 is formed of metal such as tungsten, and the semiconductor layer 25 is formed of semiconductor material such as polysilicon. The semiconductor layer 25 is located between the metal layer 23 and an electrode layer 15 in the Z direction.

As illustrated in FIGS. 2A and 2B, a plurality of electrode layers 10, 15 and 17 are stacked above the source line BSL in the Z direction and separated from each other by an interlayer insulating material. Electrode layers 15 are located between the source line BSL and the electrode layers 10 in the Z direction, and function as, for example, source-side selection gates SGS. The electrode layers 15 also include a first area, a second area, and connection areas, which are respectively located below the first area 10A, the second area 10B, and the connection areas 10C of the electrode layers 10. Electrode layers 17 are formed above the electrode layers 10, and function as, for example, drain-side selection gates SGD.

Each memory hole MH penetrates the electrode layers 10, 15 and 17 and extends in the Z direction. Inside the memory hole MH, a semiconductor pillar SP and a memory film MF are formed. That is, the semiconductor pillar SP penetrates the electrode layers 10, 15 and 17 and extends in the Z direction. The memory film MF is located between the semiconductor pillar SP and the electrode layers 10, 15 and 17, and electrically insulates the semiconductor pillar SP from these electrode layers.

The semiconductor pillar SP includes a semiconductor film 33 and an insulating core 35. The insulating core 35 extends in the Z direction inside the memory hole MH. The semiconductor film 33 is located between the memory film MF and the insulating core 35, and covers the side surface of the insulating core 35. The semiconductor film 33 is connected to the semiconductor layer 25 of the source line BSL on the bottom surface of the memory hole MH.

As illustrated in FIG. 2A, the insulators 13 are formed to penetrate the electrode layers 10, 15 and 17 and extend in the Z direction. The connection areas 10C are formed between the insulators 13 and are arranged side by side in the X direction (see FIG. 1). Thus, when viewing the stacked plurality of electrode layers 10 from the Z direction, the connection areas 10C of each electrode layer 10 overlap each other.

As illustrated in FIG. 2B, in a region in which no insulator 13 is disposed (connection area 10C), the electrode layers 10 and 15 extends over each connection area 10C; however, the electrode layer 17 is divided by a separation groove 37 above the connection area 10C. An insulating film, such as a silicon oxide film, is embedded in the separation groove 37.

Figure 3A:
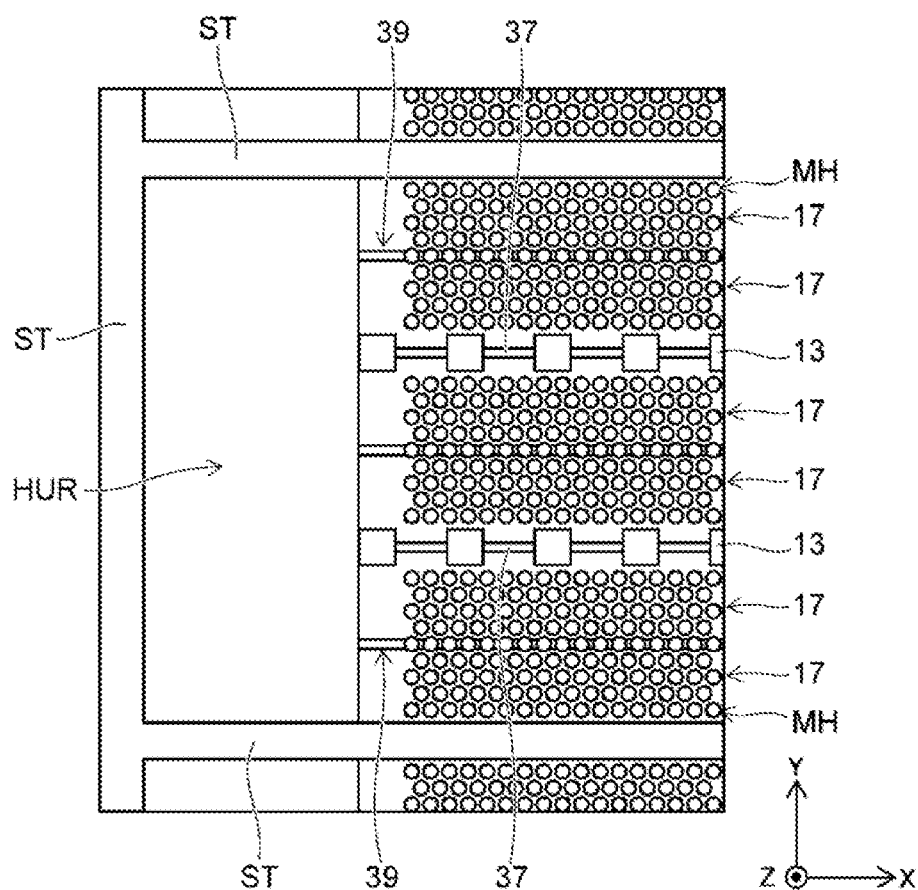
FIGS. 3A and 3B are schematic plan views of a semiconductor memory device according to the first embodiment.
Figure 3B:
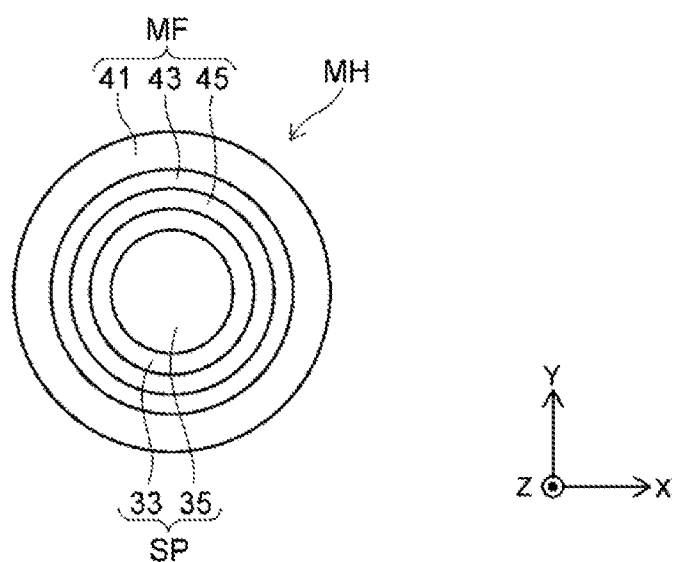

FIGS. 3A and 3B are schematic plan views of the semiconductor memory device 1 according to the first embodiment. FIG. 3A is a cross-sectional view taken along the line 3A-3A illustrated in FIGS. 2A and 2B illustrating the arrangement of the electrode layers 17. FIG. 3B is a cross-sectional view of the inside of the memory hole MH.

As illustrated in FIG. 3A, the electrode layers 17 are separated into regions arranged in the Y direction by separation grooves 37 and 39. The regions of the electrode layers 17 are controlled independently of each other. Each electrode layers 17 functions as, for example, a drain-side selection gate, and constitutes a selection transistor controlling On/Off states of the electric conduction of the semiconductor pillars SP that extends through the electrode layer 17.

As illustrated in FIG. 3B, the semiconductor pillar SP and the memory film MF are formed inside the memory hole MH. The semiconductor pillar SP includes the semiconductor film 33 and the insulating core 35, and the semiconductor film 33 is formed to surround the insulating core.

The memory film MF has a structure in which a first film 41, a second film 43, and a third film 45 are stacked. Each of the first film 41, the second film 43, and the third film 45 extends in the Z direction along the inner surface of the memory hole MH.

The first film 41 is, for example, a block insulating film containing silicon oxide. The second film 43 is, for example, a charge holding film containing silicon nitride. The third film 45 is, for example, a tunnel insulating film containing silicon oxide. By using the memory film MF having such a configuration, a memory cell can be disposed at, for example, a portion where the semiconductor pillar SP and the electrode layer 10 intersect each other.

Figure 4A:
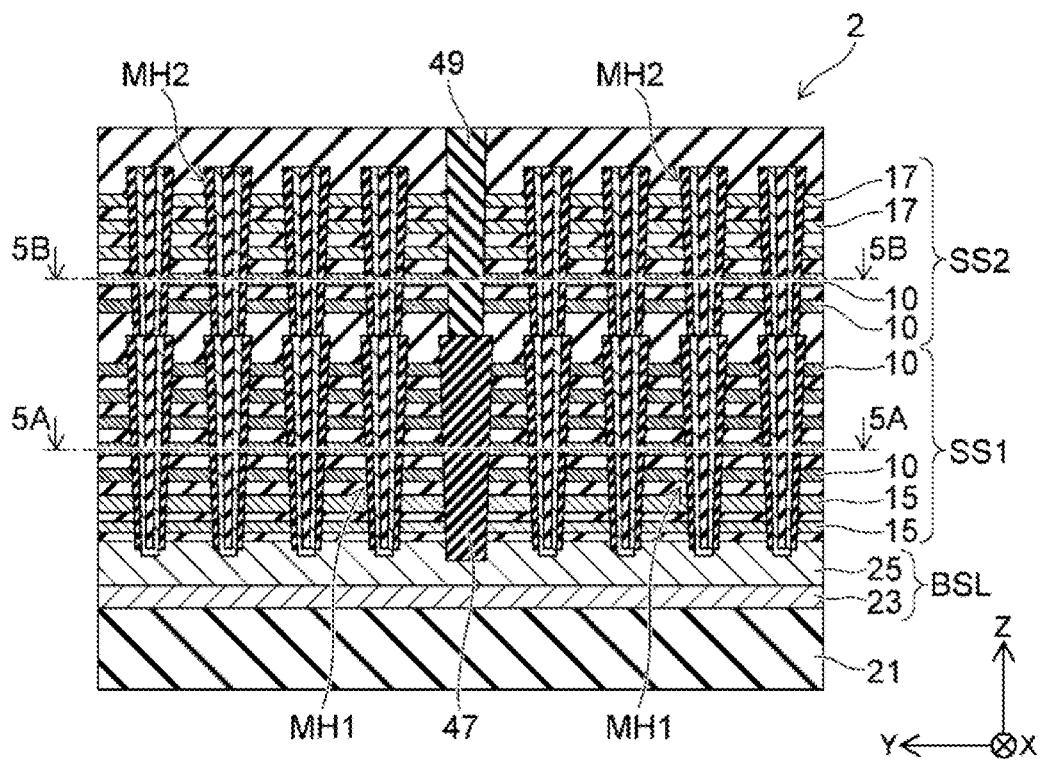
FIGS. 4A and 4B are schematic cross-sectional views of a semiconductor memory device according to a modification of the first embodiment.
Figure 4B:
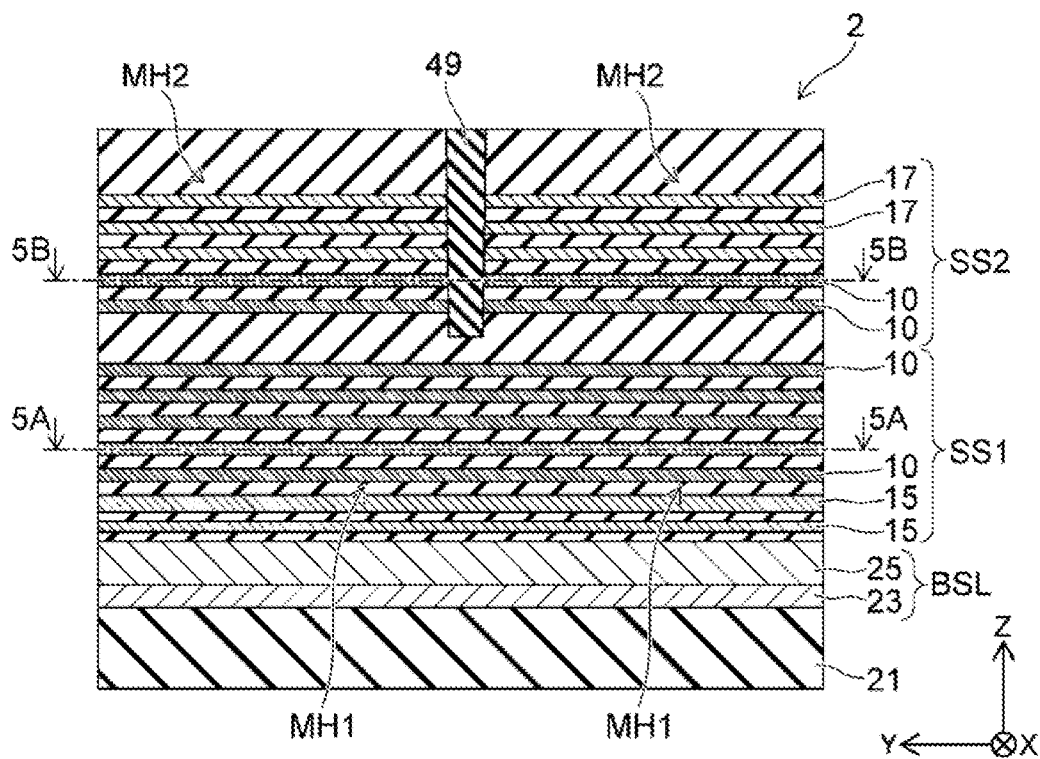

FIGS. 4A and 4B are schematic cross-sectional views each illustrating a semiconductor memory device 2 according to a modification of the first embodiment. The semiconductor memory device 2 includes a stacked body SS1 and a stacked body SS2 formed on the source line BSL. The stacked body SS2 is disposed on the stacked body SS1.

In general, it becomes more difficult to form the memory hole MH penetrating all the electrode layers 10, 15 and 17, when the number of stacked electrode layers becomes larger. However, in some examples, it is possible to first form a stacked body SS1, which includes some electrode layers 10 along with the electrode layers 15. Then, after forming a memory hole MH1 penetrating this stacked body SS1, a stacked body SS2 that includes additional electrode layers 10 along with the electrode layers 17 can be formed. The memory hole MH2 penetrating the stacked body SS2 can be formed. The memory hole MH2 can be formed to contact with the memory hole MH1. By using such a method, it is possible to form a memory hole MH through the full height of both the stacked bodies SS1 and SS2 without having to penetrate the full height in a single processing step, which provides a memory hole MH which can be longer in the Z direction.

FIG. 4A, an insulator 47 is formed in the stacked body SS1, and an insulator 49 is formed in the stacked body SS2. The insulator 47 is, for example, a columnar silicon oxide body, and is formed to penetrate the electrode layers 10 and 15 in the Z direction. The insulator 49 is formed inside a groove which extends in the X direction.

As illustrated in FIG. 4B, the portion in which no insulator 47 is formed is present in the stacked body SS1. In the stacked body SS2, the electrode layers 10 and 17 are divided by the insulator 49.

Figure 5A:
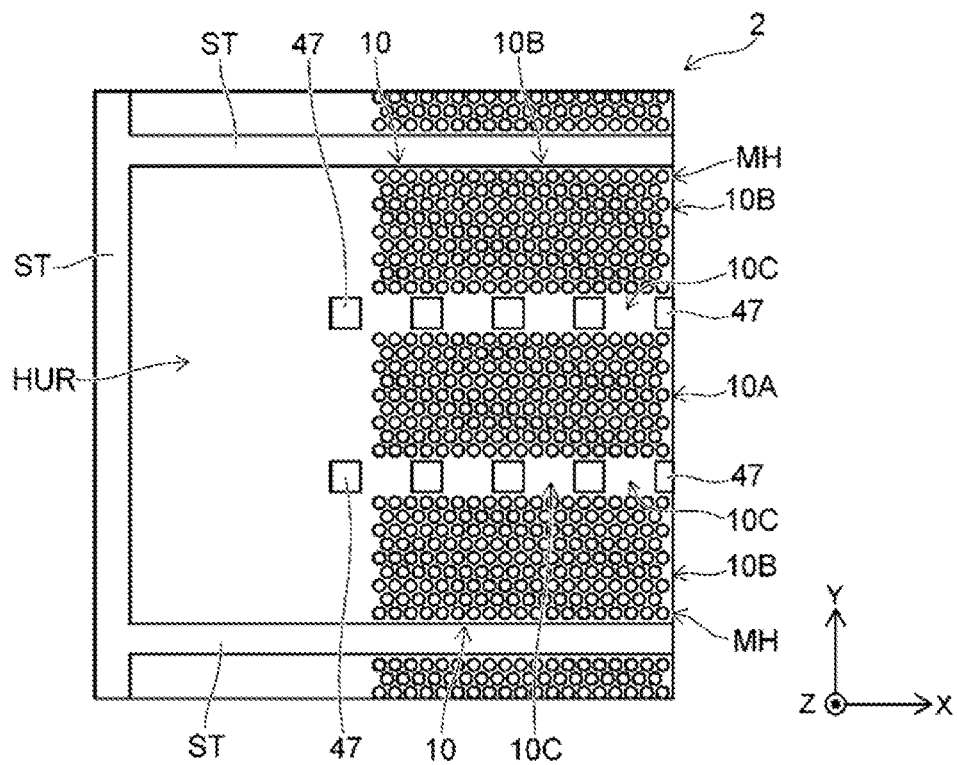
FIGS. 5A and 5B are schematic plan views of a semiconductor memory device according to the modification of the first embodiment.
Figure 5B:
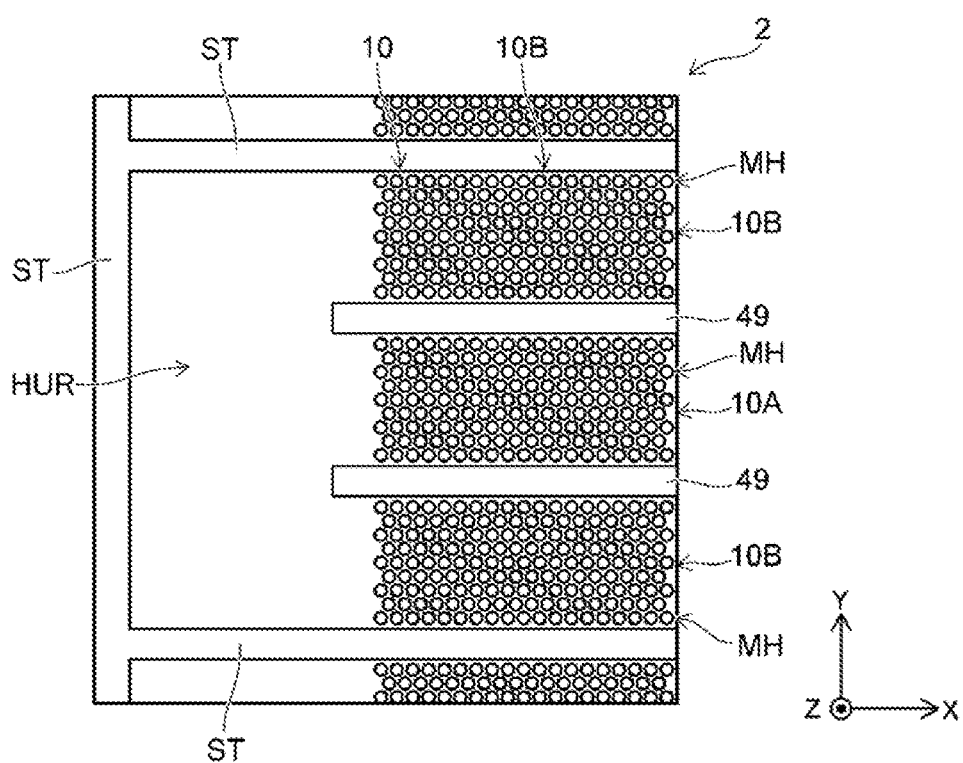

FIGS. 5A and 5B are schematic plan views of the semiconductor memory device 2. FIG. 5A is a cross-sectional view taken along the line 5A-5A illustrated in FIGS. 4A and 4B. FIG. 5B is a cross-sectional view taken along the line 5B-5B illustrated in FIGS. 4A and 4B.

As illustrated in FIG. 5A, each electrode layer 10 includes the first area 10A, the second area 10B, and the connection areas 10C. The memory holes MH are formed to penetrate the first area 10A and the second area 10B. The connection areas 10C are formed between the insulators 47, which are arranged side by side in the X direction.

As illustrated in FIG. 5B, in the electrode layers 10 provided in the stacked body SS2, each insulator 49 is formed between a first area 10A and a second area 10B to extend in the X direction. Therefore, within the stacked body SS2, there is no connection area 10C formed between the first areas 10A and the second areas 10B.

However, the electrode layers 10 according to the present embodiment can be formed to include the connection areas 10C, which enhance the strength of the stacked bodies including the electrode layers 10, 15 and 17 and to prevent the occurrence of structural defects in a process of manufacturing the semiconductor memory devices 1 and 2. It is also possible to reduce the parasitic capacitance between the first areas 10A and the second areas 10B, which function as word lines.

In a process of forming the electrode layers 10, 15 and 17, for example, after a sacrificial layer is removed from between interlayer insulating films via the slit ST, a metal layer is deposited in the space left by the removal of the sacrificial film. In this process, some of the interlayer insulating films above and below the remaining space in the connection area 10C enhance the strength of a structure after the removal of the sacrificial layer. Thus, it is possible to prevent the occurrence of structural defects in the process of forming the electrode layers 10, 15 and 17.

Second Embodiment

Figure 6:
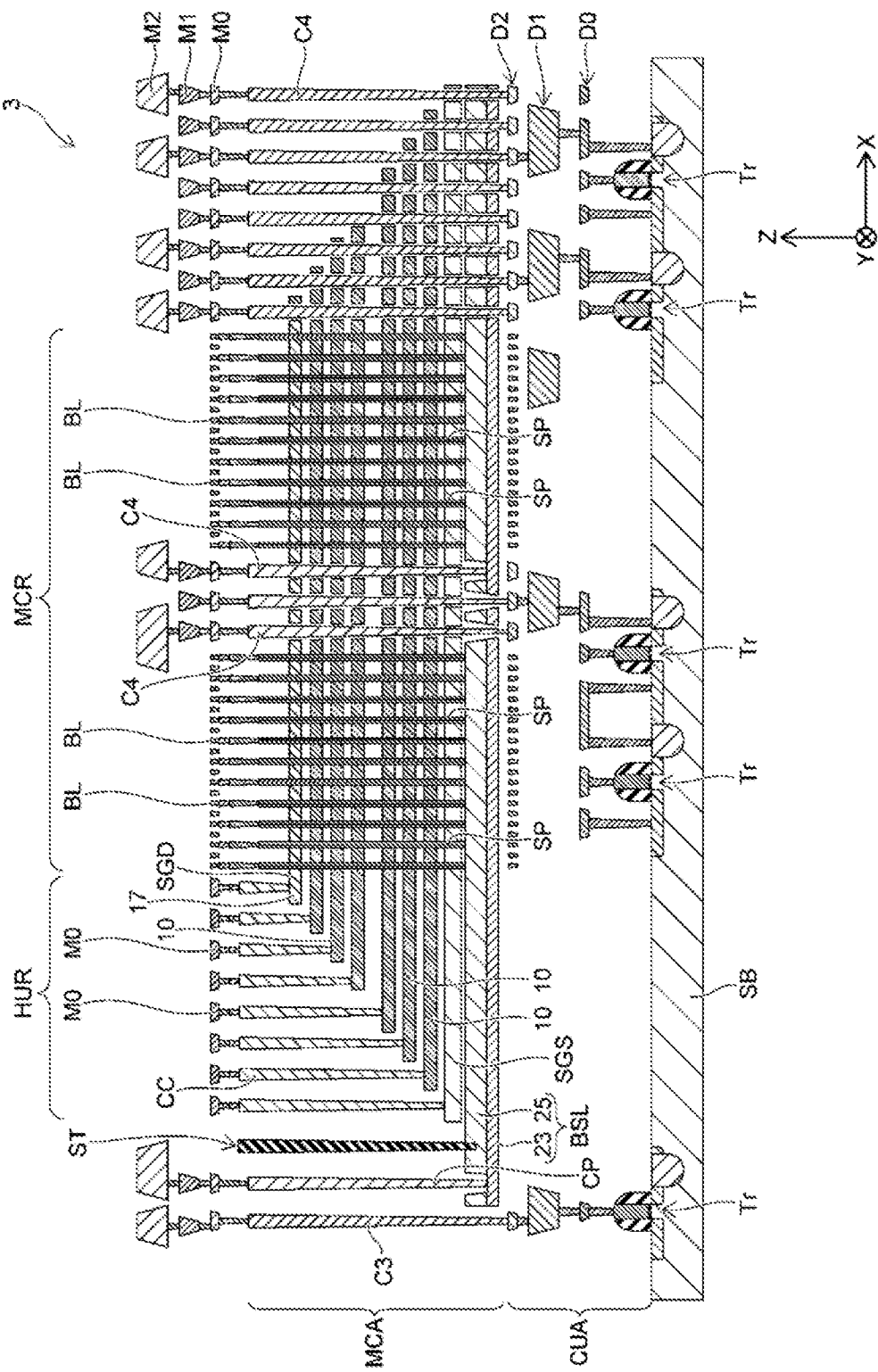
FIG. 6 is a schematic cross-sectional view of a semiconductor memory device according to a second embodiment.

FIG. 6 is a schematic cross-sectional view of a semiconductor memory device 3 according to a second embodiment. The semiconductor memory device 3 includes a memory cell array MCA and a drive circuit CUA. The drive circuit CUA includes a plurality of transistors Tr formed on a substrate SB. The memory cell array MCA is formed on the drive circuit CUA. In FIG. 6, an insulating film formed between respective components is omitted from the depiction.

As illustrated in FIG. 6, the memory cell array MCA includes a source line BSL, a selection gate SGS, electrode layers 10 and 17, and a semiconductor pillars SP. The selection gate SGS and the electrode layers 10 and 17 are stacked on the source line BSL. Each electrode layer 10 includes, for example, a first area 10A, a second area 10B, and connection areas 10C (see FIG. 1). The selection gate SGS is located between the source line BSL and the electrode layers 10 in the Z direction, and includes, for example, polysilicon.

The memory cell array MCA includes a memory cell region MCR, which includes a plurality of three-dimensionally arranged memory cells, and a lead-out region HUR. A wiring layer, which includes wirings M0, M1 and M2, is formed above the memory cell array MCA.

In the memory cell region MCR, a plurality of semiconductor pillars SP is formed to penetrate the selection gate SGS and the electrode layers 10 and 17 and extend in the Z direction. The memory cells are respectively formed at portions where the semiconductor pillars SP and the electrode layers 10 intersect each other. The semiconductor pillars SP are connected at lower ends thereof to the source line BSL. The semiconductor pillars SP are electrically connected at upper ends thereof to bit lines BL. The bit lines BL are, for example, a portion of the wiring M0, and extend in the Y direction above the electrode layer 17.

End portions of the selection gate SGS and the respective electrode layers 10 and 17 are located in the lead-out region HUR and are formed stepwise. A plurality of contact plugs CC are formed in the lead-out region HUR, and are connected to the respective end portions of the selection gate SGS and the electrode layers 10 and 17. The contact plugs CC electrically connect the selection gate SGS and the electrode layers 10 and 17 to the wiring M0.

The semiconductor memory device 3 further includes contact plugs CP, CS, C1, C2, C3, and C4. The contact plug CP is connected to the source line BSL and electrically connects the source line BSL and the wiring M0 to each other. In the drive circuit CUA, the contact plugs CS, C1, and C2 electrically connect between the transistor Tr and a wiring D0, between the wiring D0 and a wiring D1, and between the wiring D1 and a wiring D2, respectively. The contact plug C3 electrically connects between the wiring D2 and the wiring M0.

In the semiconductor memory device 3, the source line BSL, the electrode layers 10 and 17, and the semiconductor pillars SP are electrically connected to the drive circuit CUA via the wirings M0, M1 and M2 and the contact plug C3, which are formed above the memory cell array MCA. A plurality of contact plugs C4 are disposed to electrically connect the wiring D2 of the drive circuit CUA and the wiring M0 to each other. The contact plugs C4 penetrate the source line BSL and are connected to the drive circuit CUA, which is located under the source line BSL.

The contact plugs C4 are disposed so as to appropriately connect the respective electrode layers, the semiconductor pillars SP and the like to the drive circuit, and increase the degree of freedom of the circuit design of the semiconductor memory device 3. A portion of each contact plug C4 penetrates the selection gate SGS and the electrode layers 10 and 17, and is connected to the source line BSL. Thus, it is possible to compensate for a voltage drop due to the parasitic resistance of the source line BSL and to make uniform the potential distribution of the source line BSL.

Figure 7:
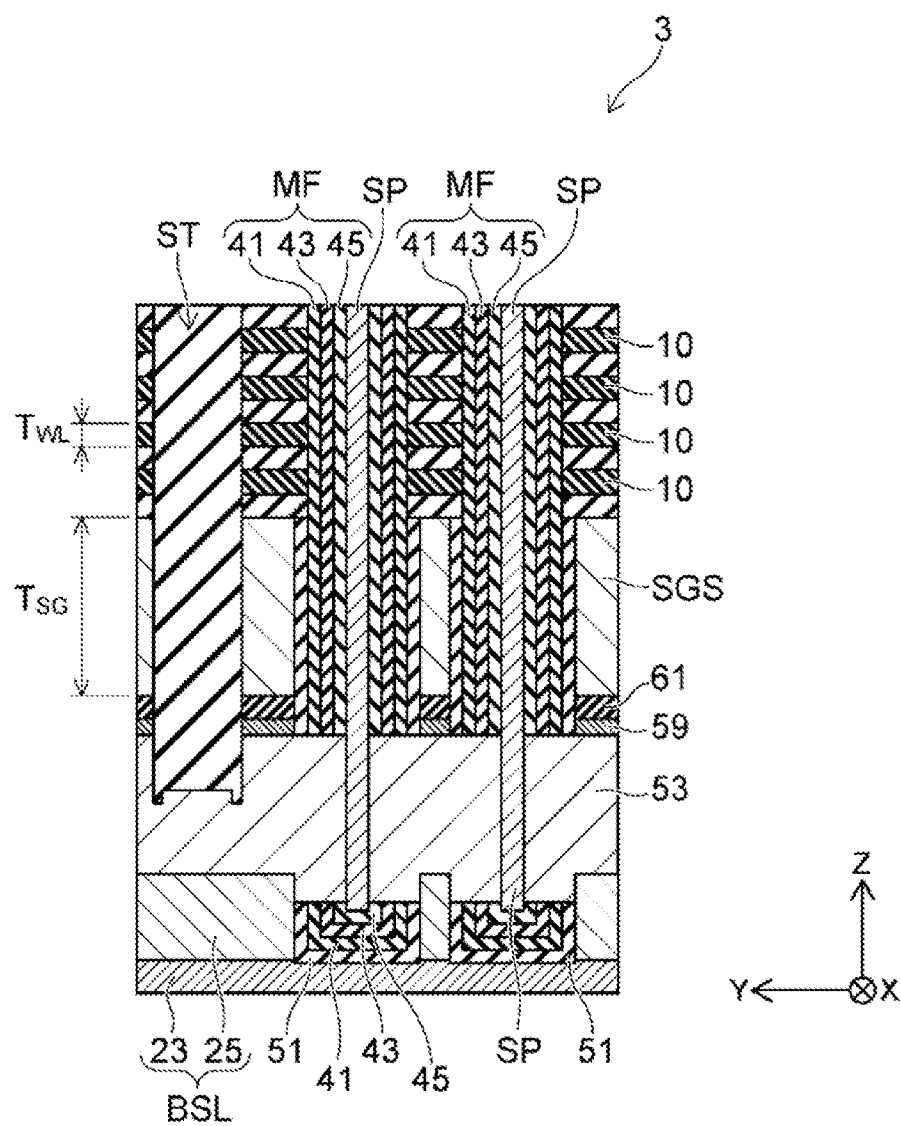
FIG. 7 is a schematic partial cross-sectional view of a semiconductor memory device according to the second embodiment.

FIG. 7 is a schematic partial cross-sectional view of a portion of the semiconductor memory device 3. FIG. 7 illustrates a connection structure between the source line BSL and the semiconductor pillars SP.

In FIG. 7, a semiconductor layer 53 is formed between the source line BSL and the selection gate SGS. Each semiconductor pillar SP is connected to the semiconductor layer 53 on the side surface of a lower end portion thereof. The semiconductor layer 53 is, for example, a conductive polysilicon layer.

As illustrated in FIG. 7, the semiconductor pillar SP is formed to penetrate the electrode layers 10 and the selection gate SGS and reach the source line BSL. The selection gate SGS is a conductive semiconductor layer, for example, a polysilicon layer. The thickness TSG of the selection gate SGS in the Z direction is greater than the thickness TWL of each electrode layer 10 in the Z direction. The lower end of the semiconductor pillar SP is electrically insulated from the source line BSL by an insulating film 51, the first film 41, the second film 43, and the third film 45.

Next, a method of manufacturing the semiconductor memory device 3 will be described with reference to FIGS.

8A, 8B, and 8C. FIGS. 8A, 8B and 8C are schematic cross-sectional views illustrating a process of manufacturing the semiconductor memory device 3 according to the second embodiment.

As illustrated in FIG. 8A, a plurality of insulating films 110 are stacked on the selection gate SGS with an interlayer insulating film being interposed therebetween. The insulating films 110 are sacrificial films, which are ultimately replaced with the electrode layers 10, and are, for example, silicon nitride films. Subsequently, memory holes MH are formed to penetrate the insulating films 110 and the selection gate SGS and reach the source line BSL.

The metal layer 23 of the source line BSL is exposed at the bottom surface of each memory hole MH. The insulating film 51 is formed on a bottom portion of the memory hole MH. The insulating film 51 is, for example, a silicon oxide film, and covers the end surface of the selection gate SGS, which is exposed to the inner wall of the memory hole MH.

An insulating film 54, a semiconductor layer 55, an insulating film 57, a semiconductor layer 59, and an interlayer insulating film 61 are formed between the source line BSL and the selection gate SGS. The insulating film 54 and the insulating film 57 are, for example, silicon oxide films. The semiconductor layers 55 and 59 are, for example, polysilicon layers.

As illustrated in FIG. 8A, a slit ST is formed to a depth at which the slit ST reaches the semiconductor layer 55. An insulating film 63 is formed to cover the inner wall of the slit ST. The insulating film 63 is, for example, a silicon nitride film. A memory film MF and a semiconductor pillar SP are formed inside each memory hole MH.

Subsequently, the semiconductor layer 55, the insulating film 54, the insulating film 57, and the memory film MF are selectively removed through the slit ST. For example, the semiconductor layer 55 is selectively etched and removed through the slit ST. Thereafter, the insulating films 54 and 57 and the memory film MF are selectively removed. Wet etching, isotropic dry etching, or the like may be used for the etching thereof.

As illustrated in FIG. 8B, a portion of the semiconductor pillar SP is exposed to the inside of a space ESP formed by etching. Subsequently, as illustrated in FIG. 8C, a raw material gas is supplied through the slit ST, and the semiconductor layer 53 is deposited inside the space ESP. Thereby, the semiconductor pillar SP and the source line BSL may be electrically connected to each other via the semiconductor layer 53.

In the etching process illustrated in FIG. 8B, stress may be applied to an exposed portion of the semiconductor pillar SP due to deformation of the stacked body including the selection gate SGS and the insulating films 110, thus causing breakage of the semiconductor pillar SP.

In the semiconductor memory device 3 according to the second embodiment, the portion that corresponds to the connection area 10C of the electrode layer 10 enhances the strength of the stacked body and prevents deformation thereof. Thus, it is possible to avoid breakage of the semiconductor pillar SP and to prevent structural defects occurring in the memory cell array MCA.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first electrode layer having a first area, a second area, and a connection area connecting the first area to the second area, the first electrode layer comprising a word line to one or more memory cells;
   a plurality of semiconductor pillars extending in a first direction through the first electrode layer in the first area and the second area; and
   a plurality of insulators extending in the first direction through the first electrode layer, wherein
   the plurality of semiconductor pillars are arranged in an array in a second direction and in a third direction intersecting with the second direction, the second direction and the third direction being parallel to a surface of the first electrode layer,
   the connection area has no semiconductor pillars disposed therein, and
   the first electrode layer in the connection area includes a portion disposed between adjacent two of the insulators.

2. The semiconductor memory device according to claim 1, further comprising:
   a source line including a metal layer and a semiconductor layer, the semiconductor layer being electrically connected to the plurality of semiconductor pillars;
   a first wiring electrically connected to the semiconductor pillars of the plurality in the first area; and
   a second wiring electrically connected to the semiconductor pillars of the plurality in the second area, wherein
   the first electrode layer in the first area is between the source line and the first wiring in the first direction, and
   the first electrode layer in the second area is between the source line and the second wiring in the first direction.

3. The semiconductor memory device according to claim 2, wherein
   an end portion of each of the semiconductor pillars on the source line side is electrically insulated from the source line, and
   a side surface of each of the semiconductor pillars is electrically connected to the source line.

4. The semiconductor memory device according to claim 2, further comprising:
   a second electrode layer between the first area of the first electrode layer and the first wiring in the first direction; and
   a third electrode layer between the second area of the first electrode layer and the second wiring in the first direction and electrically insulated from the second electrode layer,
   wherein the semiconductor pillars in the first area extend in the first direction through the second electrode layer, and
   the semiconductor pillars in the second area extend in the first direction through the third electrode layer.

5. The semiconductor memory device according to claim 4, further comprising:
   a fourth electrode layer formed of a semiconductor material and located between the first electrode layer and the source line in the first direction, wherein the fourth electrode layer includes a first area, a second area, and a plurality of connection areas, each of the plurality of connection areas connecting the first area and the second area, the semiconductor pillars in the first area of the first electrode layer extends in the first direction through the first area of the fourth electrode layer, and the semiconductor pillars extend in the second area of the first electrode layer extend in the first direction through the second area of the fourth electrode layer.

6. The semiconductor memory device according to claim 1, further comprising:

a plurality of first electrode layers, wherein each first electrode layer includes a connection area that overlaps with the connection areas of each other first electrode layer in the plurality.

7. A semiconductor memory device, comprising:

a first stacked body including a first plurality of first electrode layers stacked in a first direction, the first electrode layers of the first plurality each having a first area, a second area adjacent to the first area in second direction, and a connection area between and connecting the first area and the second area in the second direction, and each comprising a word line to one or more memory cells;

a second stacked body stacked on the first stacked body in the first direction, the second stacked body including a second plurality of first electrode layers stacked in the first direction;

a plurality of first insulators extending in the first direction through the first plurality of first electrode layers; and a plurality of semiconductor pillars extending in the first direction through the first and second stacked bodies, each semiconductor pillar having a first portion extending through the first stacked body and a second portion extending through the second stacked body, the plurality of semiconductor pillars being in an array within a plane parallel to the first electrode layers, wherein the connection area has no semiconductor pillars disposed therein, and at least one of the first plurality of first electrode layers in the connection area includes a portion disposed between adjacent two of the first insulators.

8. The semiconductor memory device according to claim 7, further comprising:

an second insulator extending in the first direction through a portion of the second stacked body.

9. The semiconductor memory device according to claim 7, further comprising:

a source line including a metal layer and a semiconductor layer, the semiconductor layer being electrically connected to the plurality of semiconductor pillars;

a first wiring electrically connected to the plurality of semiconductor pillars in the first area; and a second wiring electrically connected to the plurality of semiconductor pillars in the second area, wherein the first stacked body in the first area is between the source line and the first wiring in the first direction, and the first stacked body in the second area is between the source line and the second wiring in the first direction.

10. The semiconductor memory device according to claim 9, wherein an end portion of each semiconductor pillar on the source line side is electrically insulated from the source line, and a side surface of each semiconductor pillar is electrically connected to the source line.

11. The semiconductor memory device according to claim 9, further comprising:

a second electrode layer stacked on the second plurality of first electrode layers in the first direction, wherein the second electrode layer in the first area is isolated from the second electrode layer in the second area.

12. The semiconductor memory device according to claim 11, further comprising:

a third electrode layer formed of a semiconductor material and located between the second plurality of first electrode layers and the source line in the first direction in the first stacked body.

13. A semiconductor memory device comprising:

a source line;

a first electrode layer on the source line, the first electrode layer having a first area, a second area, and a connection area connecting the first area to the second area, and comprising a word line to one or more memory cells;

a plurality of semiconductor pillars extending in a first direction through the first electrode layer in the first area and the second area, at least one of the plurality of semiconductor pillars contacting the source line in the first area; and a plurality of insulators extending in the first direction through the first electrode layer, wherein the plurality of semiconductor pillars are arranged in an array in a second direction and in a third direction intersecting with the second direction, the second direction and the third direction being parallel to the surface of the first electrode layer, the connection area has no semiconductor pillars disposed therein, and the first electrode layer in the connection area includes a portion disposed between adjacent two of the insulators.

14. The semiconductor memory device according to claim 13, further comprising:

a first wiring electrically connected to the semiconductor pillars of the plurality in the first area; and a second wiring electrically connected to the semiconductor pillars of the plurality in the second area, wherein the source line includes a metal layer and a semiconductor layer, the semiconductor layer being electrically connected to the plurality of semiconductor pillars, the first electrode layer in the first area is between the source line and the first wiring in the first direction, and the first electrode layer in the second area is between the source line and the second wiring in the first direction.

15. The semiconductor memory device according to claim 14, wherein an end portion of each of the semiconductor pillars on the source line side is electrically insulated from the source line, and a side surface of each of the semiconductor pillars is electrically connected to the source line.

16. The semiconductor memory device according to claim 14, further comprising:

a second electrode layer between the first area of the first electrode layer and the first wiring in the first direction; and a third electrode layer between the second area of the first electrode layer and the second wiring in the first direction and electrically insulated from the second electrode layer, wherein the semiconductor pillars in the first area extend in the first direction through the second electrode layer, and the semiconductor pillars in the second area extend in the first direction through the third electrode layer.

17. The semiconductor memory device according to claim 16, further comprising:

a fourth electrode layer formed of a semiconductor material and located between the first electrode layer and the source line in the first direction, wherein the fourth electrode layer includes a first area, a second area, and a plurality of connection areas, each of the plurality of connection areas connecting the first area and the second area, the semiconductor pillars in the first area of the first electrode layer extends in the first direction through the first area of the fourth electrode layer, and the semiconductor pillars extend in the second area of the first electrode layer extend in the first direction through the second area of the fourth electrode layer.

18. The semiconductor memory device according to claim 13, further comprising:

a plurality of first electrode layers, wherein each first electrode layer includes a connection area that overlaps with the connection areas of each other first electrode layer in the plurality.

* * * * *